United States Patent
Lee

(10) Patent No.: US 7,407,881 B2
(45) Date of Patent: Aug. 5, 2008

(54) SEMICONDUCTOR DEVICE AND METHOD FOR MANUFACTURING THE SAME

(75) Inventor: Han-Choon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 266 days.

(21) Appl. No.: 11/177,921

(22) Filed: Jul. 8, 2005

(65) Prior Publication Data

US 2006/0006542 A1  Jan. 12, 2006

(30) Foreign Application Priority Data

Jul. 9, 2004  (KR)  ............... 10-2004-0053388

(51) Int. Cl.
*H01L 21/44* (2006.01)
*H01L 21/4763* (2006.01)

(52) U.S. Cl. ............... 438/643; 438/597; 438/683; 257/E21.201

(58) Field of Classification Search ............... 438/597, 438/643; 257/E21.199, E21.201
See application file for complete search history.

(56) References Cited

U.S. PATENT DOCUMENTS

| | | | |
|---|---|---|---|
| 4,789,648 A | 12/1988 | Chow et al. | |
| 4,944,836 A | 7/1990 | Beyer et al. | |
| 5,008,216 A | 4/1991 | Huang et al. | |
| 5,008,730 A | 4/1991 | Huang et al. | |
| 5,221,853 A | 6/1993 | Joshi et al. | |
| 5,401,675 A | 3/1995 | Lee et al. | |
| 5,403,779 A | 4/1995 | Joshi et al. | |
| 5,760,475 A | 6/1998 | Cronin et al. | |
| 5,889,328 A | 3/1999 | Joshi et al. | |
| 6,052,301 A | 4/2000 | Ikeda et al. | |
| 6,204,204 B1 * | 3/2001 | Paranjpe et al. | ............... 438/785 |
| 6,358,829 B2 | 3/2002 | Yoon et al. | |
| 6,491,978 B1 * | 12/2002 | Kalyanam | ............... 427/255.394 |
| 6,743,473 B1 * | 6/2004 | Parkhe et al. | ............... 427/252 |
| 6,869,876 B2 | 3/2005 | Norman et al. | |

(Continued)

FOREIGN PATENT DOCUMENTS

KR  2000-0005622  1/2000

(Continued)

OTHER PUBLICATIONS

Lee, Sook Joo, Method for Forming Copper Wiring of Semiconductor Device, English Abstract of Korean Patent Abstract 1020030003331 A, Jan. 10, 2003, Korean Intellectual Property Office, Republic of Korea.

(Continued)

*Primary Examiner*—Michael S. Lebentritt
*Assistant Examiner*—Seahvosh J Nikmanesh
(74) *Attorney, Agent, or Firm*—Andrew D. Fortney

(57) ABSTRACT

Enhanced step coverage and reduced resistivity of a TaSiN layer may be achieved when a semiconductor device is manufactured by: forming an interlayer insulating layer on a semiconductor substrate, the interlayer insulating layer having a contact hole that partially exposes the substrate; depositing a TaN thin film on the interlayer insulating layer and in the contact hole using a reaction gas containing a Ta precursor and a nitrogen source gas; removing impurities from the TaN thin film; forming a TaSiN thin film by reacting the impurity-removed TaN thin film with a silicon source gas, and repeating the TaN-depositing, impurity-removing, and silicon source gas-reacting steps.

17 Claims, 3 Drawing Sheets

U.S. PATENT DOCUMENTS

| | | |
|---|---|---|
| 6,936,538 B2 | 8/2005 | Byun |
| 6,995,081 B2 * | 2/2006 | Vaartstra ............... 438/592 |
| 7,005,372 B2 | 2/2006 | Levy et al. |
| 2003/0059980 A1 | 3/2003 | Chen et al. |
| 2005/0009325 A1 * | 1/2005 | Chung et al. ............ 438/637 |
| 2005/0054196 A1 | 3/2005 | Wu et al. |

FOREIGN PATENT DOCUMENTS

| | | |
|---|---|---|
| KR | 2002-0016312 | 3/2002 |
| KR | 20030002034 A | 1/2003 |
| KR | 20030003331 A | 1/2003 |

OTHER PUBLICATIONS

Yoon, Dong Su, Method for Forming Diffusion Barrier Layer of Tomary System of Copper Wire, English Abstract of Korean Patent Abstract 1020030002034 A, Jan. 8, 2003, Korean Intellectual Property Office, Republic of Korea.

Jang Ung Eom and Yong Su Kim: Method for Forming Tungsten Gate; Korean Patent Abstract: Publication No. 1020020016312 A; Publication Date: Mar. 4, 2002; Korean Intellectual Property Office, Republic of Korea.

Kawabataguninori, Takitamatato and Yikadadosimi: Semiconductor Memory Device; Korean Patent Abstract; Publication No. 1020000005622 A: Publication Date: Jan. 25, 2000; Korean Intellectual Property Office, Republic of Korea.

* cited by examiner

SEMICONDUCTOR DEVICE AND METHOD FOR MANUFACTURING THE SAME

CROSS-REFERENCE TO RELATED APPLICATION

This application claims priority to and the benefit of Korean Patent Application 10-2004-0053388 filed in the Korean Intellectual Property Office on Jul. 9, 2004, the entire content of which is incorporated herein by reference.

BACKGROUND OF THE INVENTION (a) Field of the Invention

The present invention relates to a semiconductor device and a method for manufacturing the same. More particularly, the present invention relates to a diffusion barrier that blocks diffusion of metal from a metal line and a method for forming such a diffusion barrier.

(b) Description of the Related Art

During a process of manufacturing a semiconductor device, a diffusion barrier is frequently formed on an interior wall of a hole such as a contact hole or a via hole, in order to prevent diffusion of a metal such as copper from a metal line into silicon and/or an oxide.

Group-II nitrides such as tantalum nitride (TaN), in which nitrogen (N) is contained in a refractory metal such as tantalum (Ta), or group-III nitrides, such as tantalum-silicon-nitride (TaSiN) containing N and silicon (Si) together with Ta, may be used for the diffusion barrier. Among the two groups of nitrides, the group-III nitride containing Si shows better performance.

In addition, a TaSiN layer is generally easily deposited, since it is usually deposited by a physical vapor deposition (PVD) method. On the other hand, the TaSiN layer formed by the PVD method shows poor step coverage for a contact hole of a high aspect ratio. In addition, sufficient (poly)silicon remains such that, when PVD TaSiN is used as a diffusion barrier for a copper line, the copper may easily diffuse to form a copper-silicon compound or alloy (CuSi) at the interface of the TaSiN layer and the copper line layer. phenomenon during thermal processing.

For such reasons, research and investigations are conducted into forming the TaSiN layer by chemical vapor deposition (CVD), which may provide better step coverage and a (more) amorphous state for the TaSiN layer. However, according to the CVD method, the substrate has to be heated to a temperature higher than 600° C. in order to obtain a sufficient reaction between the Ta precursor and the other reaction gas(es). Therefore, the method necessarily involves a high temperature, resulting in an increase in surface roughness of the layer, and in particular, a decrease in layer density, thereby causing an agglomeration phenomenon during thermal processing.

In addition, due to various residual atoms or other materials included in the Ta precursor, an undesirable amount of impurities may be included in the layer during its deposition, thereby increasing the resistivity of the TaSiN layer.

The above information disclosed in this Background section is only for enhancement of understanding of the background of the invention, and therefore, it may contain information that does not form prior art or other information that may be already known to others in this country.

SUMMARY OF THE INVENTION

The present invention has been made in an effort to provide a semiconductor device having an enhanced diffusion barrier and a manufacturing method thereof.

An exemplary semiconductor device according to an aspect of the present invention includes: a semiconductor substrate; an interlayer insulating layer on the substrate and having a contact hole therein partially exposing the substrate; and a diffusion barrier on interlayer insulating layer and in the contact hole, comprising a plurality of TaSiN thin films. The TaSiN thin film may be formed by a reaction of a silicon source gas with an impurity-removed TaN thin film.

An exemplary method for manufacturing a semiconductor device according to another aspect of the present invention includes: (a) forming an interlayer insulating layer on a semiconductor substrate, the interlayer insulating layer having a contact hole that partially exposes the substrate; (b) depositing a TaN thin film on the interlayer insulating layer and in the contact hole using a reaction gas containing a Ta precursor and a nitrogen source gas; (c) removing impurities from the TaN thin film; (d) forming a TaSiN thin film by reacting the impurity-removed TaN thin film with a silicon source gas, and (e) repeating steps (a) and (b) at least once to form a diffusion barrier comprising a plurality of TaSiN thin films. In one embodiment, the diffusion barrier (or the TaN thin film) may be formed by an ALD method.

In various other embodiments, the Ta precursor may comprise tertbutylimido(trisdiethylamide)tantalum (TBTDET), pentakis(diethylamide)tantalum (PDEAT), pentakis(dimethylamide)tantalum (PDMAT), or pentakis(ethylmethylamino)tantalum (PEMAT); $NH_3$ or $N_2$ gas may be used as the nitrogen source gas; step (b) of the method may further comprise heating the substrate a temperature of 170 to 500° C.; in step (c) of the method, the impurities may be removed by plasma processing using a hydrogen containing gas, such as $H_2$, $H_2+N_2$ or $NH_3$; the plasma processing may comprise applying a plasma power of 100-400 W for 3 to 35 seconds; and/or the silicon source gas may comprise a silane, such as $SiH_4$.

DETAILED DESCRIPTION OF THE EMBODIMENTS

An embodiment of the present invention will hereinafter be described in detail with reference to the accompanying drawings.

Firstly, a diffusion barrier of a semiconductor device according to an exemplary embodiment of the present invention will hereinafter be described with reference to FIG. 1E.

Figure 1A:
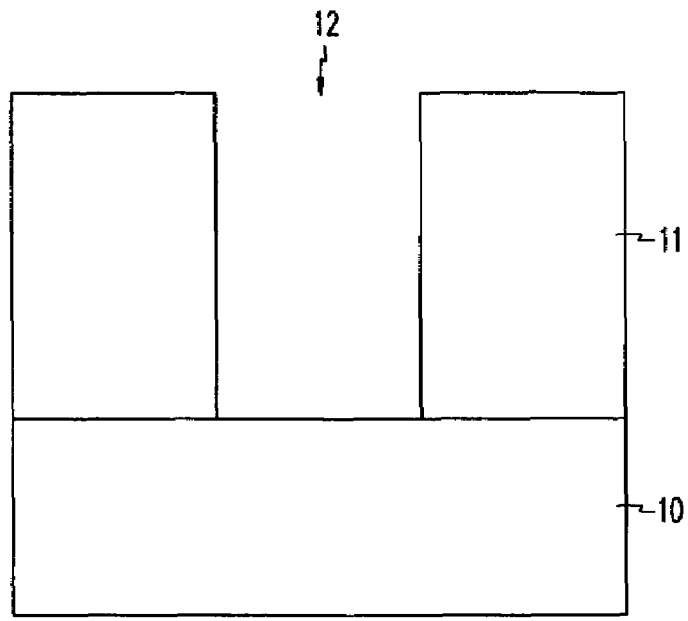
FIG. 1A to FIG. 1E are sectional views showing sequential stages of a method for forming a diffusion barrier according to an exemplary embodiment of the present invention.
Figure 1B:
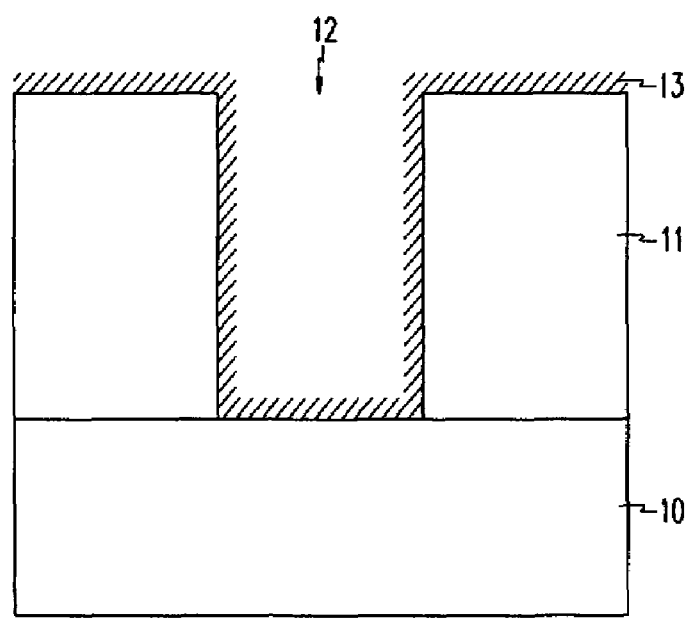
Figure 1C:
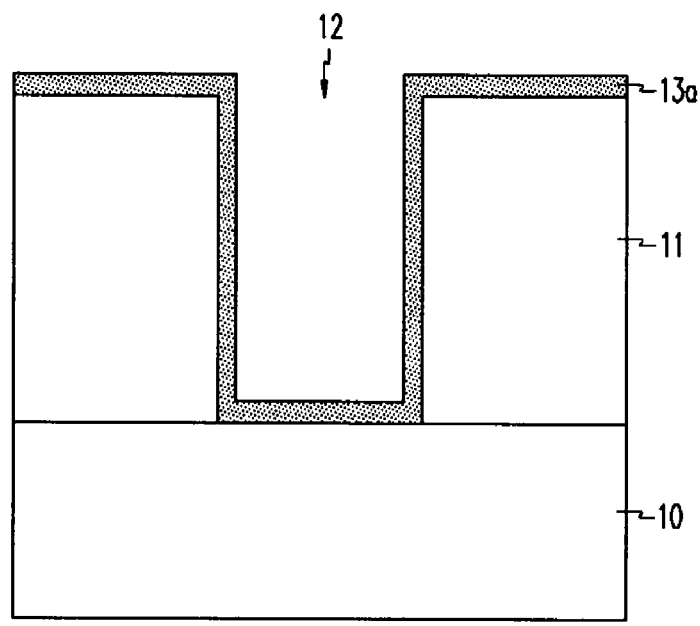
Figure 1D:
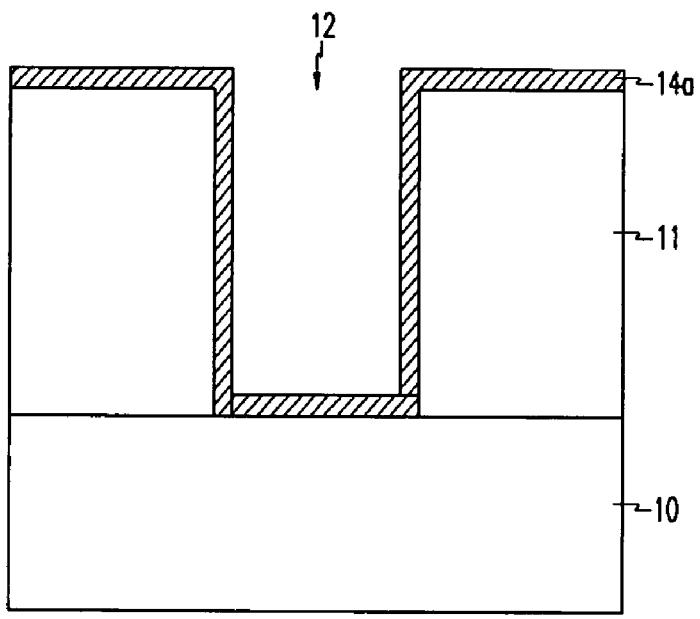
Figure 1E:
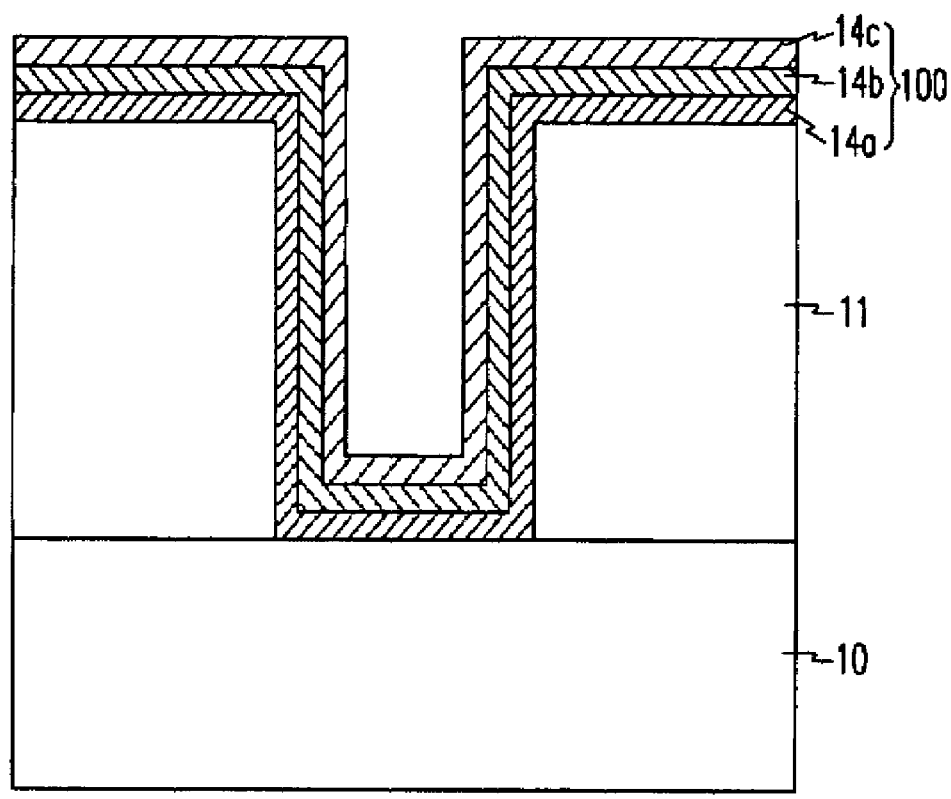

As shown in FIG. 1E, an interlayer insulating layer 11 is formed on a semiconductor substrate 10 such that the substrate 10 may be partially exposed through a contact hole (reference 12 in FIG. 1A). A diffusion barrier 100 composed of multiple layers (i.e., at least two layers, for example, three layers) of TaSiN thin films 14a, 14b, and 14c, is formed on the interlayer insulating layer 11, including in the contact hole 12.

In one embodiment, one or more layers of the diffusion barrier 100 is formed by an atomic layer deposition (ALD) method, wherein the respective TaSiN thin films 14a, 14b, and 14c may comprise the reaction product(s) of an impurity-removed TaN thin film and a silicon (Si) source gas. In one implementation, all of the layers of the diffusion barrier 100 comprise atomic layer deposited (ALD) TaSiN. The silicon source gas may comprise a silane of the formula $Si_xH_y$, where x is an integer of from 1 to 4 and y is 2x+2, and when x is 3 or 4, y may be 2x. In a preferred embodiment, the silicon source gas comprises $SiH_4$.

In addition, the impurity-removed TaN thin film may comprise a plasma processed TaN thin film. In one embodiment, the TaN thin film is processed with a plasma comprising a mixture of a hydrogen (H) containing gas and a noble gas. The hydrogen-containing gas may comprise $H_2$, $H_2+N_2$ or $NH_3$, and the noble gas may comprise He, Ne, Ar, Xe, or Kr (preferably Ar). The TaN thin film may have a thickness, for example, in a range of from 2 to 100 Å.

Hereinafter, a method for forming a diffusion barrier according to an exemplary embodiment of the present invention will be described in detail with reference to FIG. 1A to FIG. 1E.

As shown in FIG. 1A, the interlayer insulating layer 11 is deposited on the semiconductor substrate 10, and then a contact hole 12 for partially exposing the substrate 10 is formed by patterning the interlayer insulating layer 11 by conventional photolithography and etching.

In the stage shown in FIG. 1B, a TaN thin film 13 is deposited on the interlayer insulating layer 11 and in the contact hole 12 at a thickness of 2 to 100 Å, preferably by the ALD method. In the ALD method, reaction gases including a Ta precursor and a nitrogen source gas are injected into a chamber, and then the substrate is heated to a temperature controlled between 170 and 500° C. The Ta precursor may comprise a tantalum compound of the formula $Ta(NR_2)_5$ or $R'N=Ta(NR_2)_3$, where R and R' are independently an alkyl, cycloalkyl, alkenyl, cycloalkenyl, or aryl group. Preferably, R is $C_1$-$C_4$ n-alkyl, and R' is $C_1$-$C_6$ branched alkyl. More specifically, the Ta precursor may comprise one or more members of the group consisting of tert-butylimido(trisdiethylamide)tantalum (TBTDET), pentakis(diethylamide)tantalum (PDEAT), pentakis(dimethylamide)tantalum (PDMAT), pentakis(ethylmethylamino)tantalum (PEMAT), etc. The Ta precursor is generally thermally decomposed (generally in the presence of the nitrogen source gas) to form the TaN thin film 13. The nitrogen source gas may comprise $NH_3$, $N_2H_4$ or $N_2$ (the latter of which may further comprise $H_2$).

A lot of impurities are usually contained in the TaN thin film 13 due to various residual materials included in the Ta precursor, particularly from the covalently bound organic (carbon-containing) groups in the preferred Ta precursors. Thereby, the TaN thin film 13 generally has a higher resistivity than is optimal or desired. Therefore, such residual materials should be removed.

In the stage shown in FIG. 1C, a hydrogen (H)-containing gas (such as $H_2$, $H_2+N_2$, $N_2H_4$ or $NH_3$) and a noble gas (such as Ar) are injected into the chamber, and then the TaN thin film 13 is plasma processed, for example under a plasma power of 100-400 W for a time sufficient to reduce the carbon content of the TaN film (e.g., a time of from 3-35 seconds). Then, the impurities within the layer and H atoms from the hydrogen-containing gas are believed to react with each other, and resultant volatile chemical compound becomes extracted or exhausted to outside the chamber, such that the impurities are resultantly removed from the layer 13. Therefore, the resistivity of the TaN thin film 13a becomes lower.

Then, in the stage shown in FIG. 1D, the TaSiN thin film 14a is formed by injecting or otherwise introducing a silicon (Si) source gas into the chamber such that the Si from the Si source gas may react with the TaN thin film 13a. In a preferred embodiment, $SiH_4$ gas may be used as the silicon source gas.

The process for forming the TaSiN thin film 14a described above with reference to FIG. 1B to FIG. 1D is repeated at least once to form a multiple-layered diffusion layer 100, or until the diffusion barrier may have a desired thickness. As shown in FIG. 1E, the process for forming the TaSiN thin film (e.g., FIGS. 1B to 1D) is repeated twice such that the diffusion barrier 100 may have a triple layer structure of TaSiN thin films 14a, 14b, and 14c. The process for forming the TaSiN thin film may be also repeated more than twice, that is, a few times to a few hundred times, such that the diffusion barrier may have numerous multiples or substantially any number of layers.

As described above, according to an embodiment of the present invention, impurities are removed from a TaN thin film by a plasma processing using a gas containing hydrogen (H) atoms, and then a TaSiN thin film is formed by reacting the purified TaN thin film and a gas containing silicon (Si). Therefore, a resistivity of the TaSiN thin film may be lowered.

In addition, according to an embodiment of the present invention, a process for forming a TaSiN thin film may be performed at a relatively low temperature by the ALD method, and the TaSiN thin film may be formed to a desired thickness by repeating the process as many times as desired or required. Therefore, such a TaSiN may have an enhanced surface state, and shows enhanced step coverage for a contact hole having a high aspect ratio. Furthermore, the same ALD apparatus and Ta precursor as conventionally used may be used without alteration, and therefore, the method may be easily applied in the field.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a semiconductor device, comprising:
   (a) forming an insulating layer on a semiconductor substrate, the insulating layer having a contact hole that partially exposes the substrate;
   (b) depositing a TaN thin film on the insulating layer including in the contact hole by atomic layer deposition (ALD) using a reaction gas containing a Ta precursor and a nitrogen source gas, wherein depositing the TaN thin film comprises thermally decomposing the Ta precursor;
   (c) removing impurities from the TaN thin film;
   (d) forming a TaSiN thin film by reacting the impurity-removed TaN thin film with a silicon source gas; and
   (e) repeating steps (b) and (d) at least once to form a diffusion barrier comprising a plurality of TaSiN thin films.

2. The method of claim 1, wherein the Ta precursor comprises a member selected from the group consisting of tert-butylimido(trisdiethylamide)tantalum (TBTDET), pentakis(diethylamide)tantalum (PDEAT), pentakis(diethylamide)tantalum (PDMAT) and pentakis(ethylmethylamino)tantalum (PEMAT).

3. The method of claim 1, wherein the nitrogen source gas comprises $NH_3$ or $N_2$.

4. The method of claim 1, wherein step (b) further comprises heating the substrate to a temperature of 170 to 500° C.

5. The method of claim 1, wherein the TaN thin film is deposited to a thickness of 2 to 100 Å.

6. The method of claim 1, wherein removing impurities comprises plasma processing using a hydrogen containing gas.

7. The method of claim 6, wherein the hydrogen containing gas comprises $H_2$ or $NH_3$.

8. The method of claim 6, wherein the plasma processing is performed under a plasma power of 100-400 W for 3 to 35 seconds.

9. The method of claim 6, wherein the plasma processing further uses a noble gas.

10. The method of claim 1, wherein the silicon source gas comprises $SiH_4$.

11. The method of claim 7, wherein the hydrogen containing gas comprises $H_2$.

12. The method of claim 11, wherein the hydrogen containing gas further comprises $N_2$.

13. The method of claim 1, wherein the Ta precursor comprises a tantalum compound of the formula $Ta(NR_2)_5$ or $R'N{=}Ta(NR_2)_3$, where R and R' are independently an alkyl, cycloalkyl, alkenyl, cycloalkenyl or aryl group.

14. The method of claim 1, wherein the Si source gas comprises a silane of the formula $Si_xH_y$, where x is an integer of from 1 to 4 and y is 2x+2, and when x is 3 or 4, y may be 2x.

15. The method of claim 6, wherein plasma processing occurs under a plasma power of 100-400 W for a time sufficient to reduce the carbon content of the TaN thin film.

16. The method of claim 1, comprising repeating steps (b)-(d) two or more times.

17. The method of claim 1, comprising repeating steps (b)-(d) from a few times to a few hundred times.

* * * * *